US011694976B2

(12) United States Patent
Cai et al.

(10) Patent No.: US 11,694,976 B2
(45) Date of Patent: Jul. 4, 2023

(54) BOWL SHAPED PAD

(71) Applicant: Intel Corporation, Santa Clara, CA (US)

(72) Inventors: Yuhong Cai, Folsom, CA (US); Sireesha Gogineni, Folsom, CA (US); Yi Xu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 1120 days.

(21) Appl. No.: 16/158,042

(22) Filed: Oct. 11, 2018

(65) Prior Publication Data

US 2020/0118954 A1    Apr. 16, 2020

(51) Int. Cl.
*H01L 23/00*    (2006.01)

(52) U.S. Cl.
CPC ............ *H01L 24/05* (2013.01); *H01L 24/03* (2013.01); *H01L 24/13* (2013.01); *H01L 2224/03612* (2013.01); *H01L 2224/0401* (2013.01); *H01L 2224/05011* (2013.01); *H01L 2224/13026* (2013.01)

(58) Field of Classification Search
CPC ......... H01L 24/05; H01L 24/03; H01L 24/13; H01L 2224/03612; H01L 2224/0401; H01L 2224/05011; H01L 2224/13026; H01L 23/49816; H01L 21/4853; H01L 23/49811; H01L 2224/05647; H01L 2224/81815; H05K 3/4007
See application file for complete search history.

(56) References Cited

U.S. PATENT DOCUMENTS

| 7,095,116 | B1* | 8/2006 | Kelkar | H01L 24/05 |
| | | | | 257/737 |
| 10,276,480 | B1* | 4/2019 | Lu | H01L 23/3157 |
| 10,707,094 | B2* | 7/2020 | Chen | H01L 21/4846 |
| 11,437,295 | B2* | 9/2022 | Kim | H01L 23/3677 |
| 2003/0214036 | A1* | 11/2003 | Sarihan | H01L 21/2885 |
| | | | | 257/E21.507 |
| 2007/0063302 | A1* | 3/2007 | Chen | H01L 23/49811 |
| | | | | 257/459 |
| 2015/0170995 | A1* | 6/2015 | Chen | H01L 23/293 |
| | | | | 257/774 |
| 2015/0303157 | A1* | 10/2015 | Uzoh | H01L 21/4853 |
| | | | | 438/614 |

* cited by examiner

*Primary Examiner* — Douglas W Owens
(74) *Attorney, Agent, or Firm* — Schwabe, Williamson & Wyatt, P.C.

(57) ABSTRACT

Embodiments described herein provide techniques for forming an interconnect structure that includes a bowl shaped pad. Such embodiments can assist with improving interconnect joint reliability when compared to conventional pads that have a flat surface. An interconnect structure may comprise: a substrate (e.g., a semiconductor package, a PCB, etc.); and a metal pad over the substrate. The metal pad has a center region and an edge region. A thickness of the center region is smaller than a thickness of the edge region. A thickness of the center region may be non-uniform. The center region may have a bowl shape characterized by a stepped profile. The stepped profile is formed from metal layers arranged as steps. Alternatively, or additionally, the center region may have a bowl shape characterized by a curved profile. A pattern may be formed on or in a surface of the metal pad.

16 Claims, 9 Drawing Sheets

BOWL SHAPED PAD

BACKGROUND

Field

Embodiments described herein generally relate to substrates (e.g., semiconductor packages, printed circuit boards (PCB), etc.). More particularly, but not exclusively, embodiments described herein relate to an interconnect structure that is on or part of a substrate.

Background Information

A conventional pad on a substrate has a flat surface characterized by a uniform thickness. As a result, the pad has a limited contact area with solder (e.g., a ball grid array (BGA) solder ball, etc.) used to form an interconnect joint between two pads. The limited contact area reduces reliability of the interconnect joint.

Traditionally, underfill materials or glues have been used to improve interconnect joint reliability. These techniques, however, have some drawbacks. Using an underfill material to improve interconnect joint reliability includes distributing the underfill material from an edge region of a substrate to all other regions of the substrate. In this way, the interconnect joint is encapsulated by the underfill material. In order to achieve an acceptable distribution, the underfill material is formed from specialized materials, which are costly to design and manufacture. A glue can also be used to improve interconnect joint reliability, however, glue is only applied to predetermined locations on a substrate, such as around the interconnect joint. Similar to the underfill materials, glues can be costly to design and manufacture. Another drawback of using underfill materials and glues is suboptimal control during semiconductor manufacturing and packaging processes. Also, use of underfill materials and glues limits solder rework due to costs associated with manipulating previously applied underfill materials or glues on interconnect joints. Consequently, some existing techniques for improving interconnect joint reliability are suboptimal.

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

DETAILED DESCRIPTION

Figure 1A:
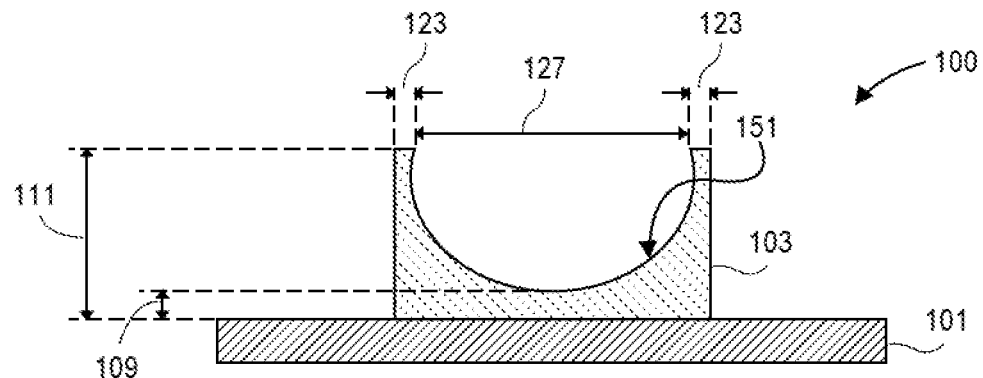
FIGS. 1A-1C are cross sectional illustrations of embodiments of an interconnect structure that includes a bowl shaped pad.

In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein provide techniques for forming an interconnect structure that assist with improving interconnect joint reliability when compared to conventional techniques. More specifically, embodiments of the interconnect structure described herein can assist with minimizing or eliminating one or more of the drawbacks associated with underfill materials and glues, as described above. The interconnect structure can be conceptually understood as having a pad characterized by a non-uniform thickness, as opposed to a pad with a flat surface that is characterized by a uniform thickness. Embodiments of a pad characterized by a non-uniform thickness may sometimes be referred to as a bowl shaped pad herein. A pad with a flat surface that has a uniform thickness is sometimes referred to as a flat pad herein.

A flat pad's uniform thickness causes a limited contact area for solder used to form an interconnect joint between the flat pad and another pad. This limited contact area can reduce interconnect joint reliability. In contrast, embodiments of the interconnect structure described herein include a bowl shaped pad characterized by a non-uniform thickness. The bowl shaped pad has an increased contact area for solder used to form an interconnect joint between the bowl shaped pad and another pad when compared to the limited contact area of a flat pad. This increased contact area assists with improving reliability of the interconnect joint.

In an embodiment, the interconnect structure may comprise a non-uniform thickness. For example, the interconnect structure may be a bowl-shaped pad. In an embodiment, the bowl-shaped pad may comprise a stepped profile, a curved profile, or a combination thereof. In an embodiment, the interconnect structure with a non-uniform thickness may be formed with subtractive or additive processes. For example, an additive process may include forming the bowl shaped pad by depositing metallic materials on a substrate to form the bowl shaped pad. For another example, a subtractive process may include forming the bowl shaped pad by etching one or more metal layers on a substrate.

Referring now to FIG. 1A, a cross sectional illustration of one embodiment of an interconnect structure 100 is shown, in accordance with an embodiment. The interconnect structure 100 includes a substrate 101, which may be any substrate known in the art. For example, a semiconductor package, a PCB, an interposer, etc. The substrate 101 can be formed from an inorganic material, an organic material, or any combination thereof. The substrate 101 can be a cored or coreless substrate. The interconnect structure 100 also includes a bowl shaped pad 103 formed from a metallic material (e.g., copper, any other suitable metallic material or combination of metallic materials known in the art, etc.). As shown in FIG. 1A, the bowl shaped pad 103 includes an edge region 123 that surrounds a center region 127. In an embodiment, a thickness 109 of the center region 127 is smaller than a thickness 111 of the edge region 123. In an embodiment, thickness 109 of the center region 127 is non-uniform and thickness 111 of the edge region is substantially uniform. In FIG. 1A, the edge region 123 is shown as having a substantially flat surface. Other embodiments are not so limited. For example, the surface of the edge region 123 may be non-vertical (e.g., slanted, etc.), non-horizontal (e.g., sloped, etc.), or any combination thereof.

In an embodiment, the center region 127 of pad 103 may comprise a majority of the total surface area of the pad 103 facing away from substrate 101 (i.e., the total surface area of the pad 103 facing away from substrate 101 being the combined surface area of the center region 127 and the edge region 123). For example, the center region 127 may comprise at least 50% of the total surface area, at least 75% of the total surface area, or at least 90% of the total surface area.

In an embodiment, the minimum thickness of the center region 127 may be approximately equal to a target solder ball diameter. In an embodiment, the difference between the thickness 111 of the edge region 123 and the minimum thickness of the center region 127 may range from approximately 30% to approximately 50% of the target solder ball height. In a particular embodiment, the center region 127 of the bowl shaped pad 103 may have a curved profile with a curved surface 151, and the edge region 123 may have a substantially flat surface 123.

Figure 1B:
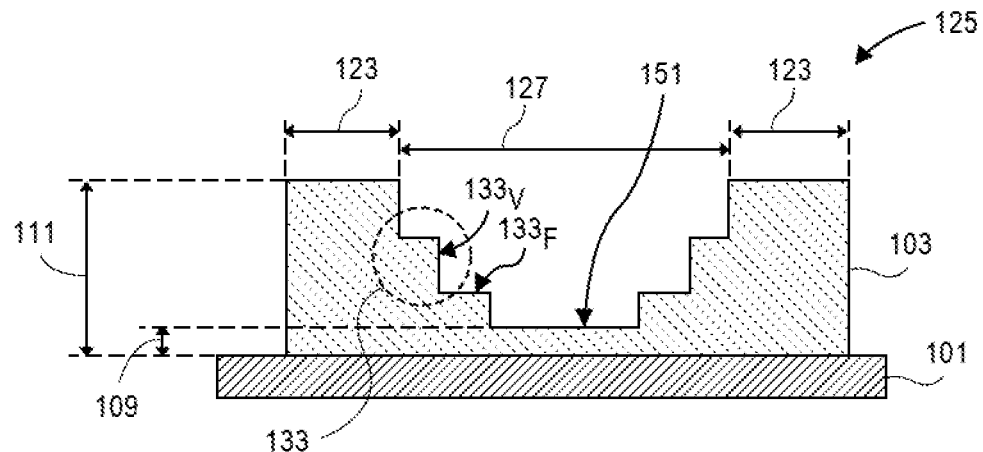

While the center region 127 is shown with a profile that forms a continuous and symmetric curve, it is to be appreciated that embodiments are not limited to such configurations. For example, FIG. 1B shows a cross sectional illustration of an interconnect structure 125 that includes a bowl shaped pad 103 with a center region 127 that has a non-uniform thickness with a stepped surface, in accordance with an embodiment. In an embodiment, interconnect structure 125 may be substantially similar to interconnect structure 100 described with respect to FIG. 1A, with the exception that the surface 151 of the center region 127 is not a continuous curve. Instead, surface 151 of center region 127 may have a stepped profile including one or more steps 133. In an embodiment, the steps 133 may comprise alternating substantially flat surfaces 133F that are substantially parallel to the substrate 101 and substantially vertical surfaces 133v. While the rise of the steps 133 (i.e., surfaces 133v) are shown as being substantially vertical, it is to be appreciated that embodiments may also include surfaces 133v that are non-vertical (e.g., sloped, tapered, etc.).

In the embodiment shown in FIG. 1B, three steps 133 are shown in the center region 127. However, it is to be appreciated that there may be any number of steps 133. In an embodiment, the flat surfaces 133F are all shown as being substantially equal in width. However, it is to be appreciated that the width of each flat surface 133F does not need to be uniform. For example, the width of the flat surfaces 133F on one step 133 may be larger or smaller than the width of the flat surfaces 133F on a different step 133. Similarly, the height of each vertical surface 133v does not need to be the same for each step 133, in some embodiments. Furthermore, steps do not have to be symmetrically aligned, even though the illustrated example shows the steps as symmetrically aligned.

Figure 1C:
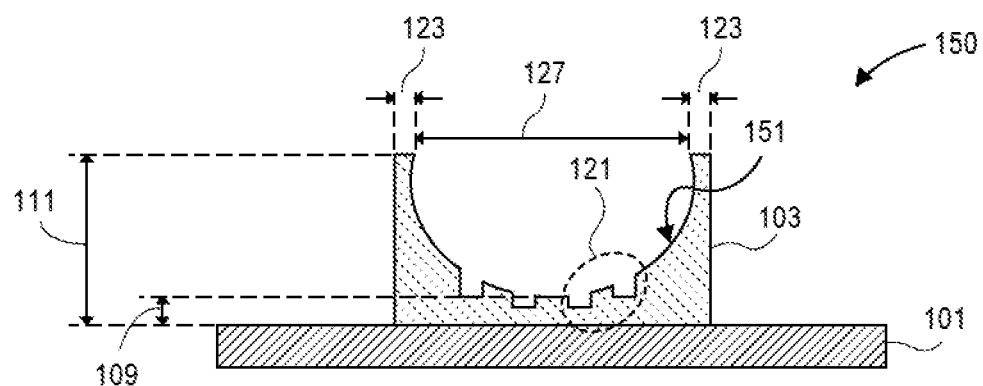

In addition to increasing the surface area of an interconnect structure by providing a center region with a non-uniform thickness, the surface area may be further increased by forming one or more recessed patterns into the surface of the center region. An example of such a configuration is shown in FIG. 1C. In an embodiment, interconnect structure 150 of FIG. 1C may be substantially similar to interconnect structure 100 described with respect to FIG. 1A, with the exception that the surface 151 of FIG. 1C includes recessed patterns 121 formed therein. That is, the surface 151 of center region 127 in the structure 150 may have a curved profile including one or more recessed patterns 121 formed in the surface 151. In an embodiment, the recessed pattern(s) 121 may comprise any shape known in the art. Furthermore, the recessed pattern(s) 121 may be formed in 100% or less than 100% of the surface 151. For example, and as shown in FIG. 1C, the recessed pattern(s) 121 are formed in less than 100% of the surface 151. Other embodiments, however, are not so limited. That is, the entirety of the surface 151 may comprise recessed pattern(s) 121 formed therein.

Furthermore, the recessed pattern(s) 121 may comprise any suitable wall profile or combination of wall profiles known in the art. For example, and as shown in FIG. 1C, a recessed pattern 121 comprises a wall profile that is formed as a trench (i.e., two substantially vertical side walls separated by a substantially horizontal bottom wall). Other embodiments, however, are not so limited. For example, a recessed pattern 121 may exhibit a wall profile that comprises side or bottom walls that are: non-vertical (e.g., sloped, tapered, etc.); non-horizontal (e.g., sloped, etc.), or any combination thereof. Additionally, the spacing of the patterns may be uniform, non-uniform, or any combination thereof. For example, and as shown in FIG. 1C, the spacing of the recessed pattern(s) 121 is uniform such that the recessed pattern(s) 121 are formed at regular intervals in the surface 151. Other embodiments, however, are not so limited. That is, the spacing of the recessed pattern(s) 121 may be non-uniform such that the recessed pattern(s) 121 are formed at irregular intervals in the surface 151.

FIGS. 2A-2G provide plan view illustrations of exemplary patterns that may be integrated into the center regions, in accordance with various embodiments. That is, the patterns illustrated in FIGS. 2A-2G may be recesses formed into the center region, similar to the recessed patterns 121 shown in the cross-sectional view of FIG. 1C. In an embodiment, a pattern can have any shape. The patterns in FIGS. 2A-2G are merely illustrative examples, not exhaustive examples.

In an embodiment, the interconnect structure 203 may have a circular shape, a non-circular shape, or any combination thereof. For example, and as shown in each of FIGS. 2A-2G, the interconnect structure 203 is shown with a substantially circular shape. However, it is to be appreciated that the interconnect structures 203 may have non-circular shapes (e.g., rectangular, square, elliptical, etc.) or a combination of circular and non-circular shapes. In each of the FIGS. 2A-2G, an edge region 223 is shown surrounding the center region 227. While the center region 227 is shown without any further indication of its profile, it is to be appreciated that the center region 227 may have a continuous curve (e.g., similar to FIG. 1A), have a stepped surface (e.g., similar to FIG. 1B), or a surface (e.g., curved, stepped, a combination thereof, etc.) into which the patterns are integrated (e.g., similar to FIG. 1C). Furthermore, while the patterns are illustrated with lines of substantially uniform thickness, it is to be appreciated that the patterns do not have to be lines and do not require features with a uniform width. It is also to be appreciated that two or more of the patterns shown in FIGS. 2A-2G may be combined with each other.

Figure 2A:
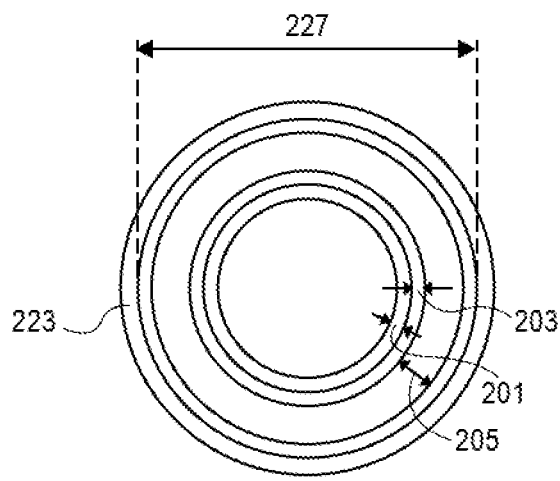
FIGS. 2A-2G are plan view illustrations of embodiments of an interconnect structure that includes a bowl shaped pad and features patterned into the bowl shaped pad.

FIG. 2A illustrates an interconnect structure with a pattern formed from circles. It is to be appreciated that the pattern shown in FIG. 2A can be formed from one or more circles. For example, the pattern can be formed from: two or more concentric circles; two or more non-concentric circles; or any combination thereof. Furthermore, the spacing between the circles can be uniform or non-uniform. For example, and as shown in FIG. 2A, the spacing 201 and the spacing 203 are uniform with regard to each other, while the spacing 205 is non-uniform with regard to each of the spacing 201 and the spacing 203.

Figure 2B:
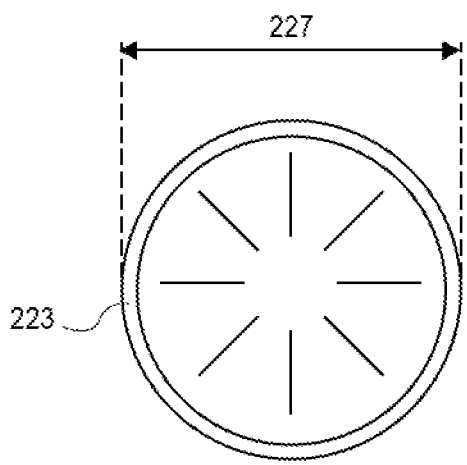
Figure 2C:
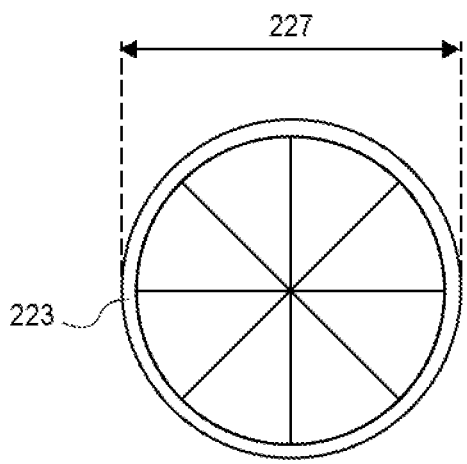

FIGS. 2B-2C illustrate an interconnect structure with a pattern formed from straight line segments that extend from an edge region of the interconnect structure to the center region of the interconnect structure. The pattern shown in FIG. 2B differs from the pattern shown in FIG. 2C because the pattern shown in FIG. 2B comprises line segments that do not intersect each other, while the pattern shown in FIG. 2C comprises line segments that intersect each other. Furthermore, there may be any number of line segments used to form the patterns in FIGS. 2B-2C. Additionally, the line segments in FIGS. 2B-2C may or may not extend from the perimeter of the edge region 223 to the center of the center region 227. For example, the line segments may not align with the center of the center region 227 and may be vertical, horizontal, non-vertical, non-horizontal, or any combination thereof.

Figure 2D:
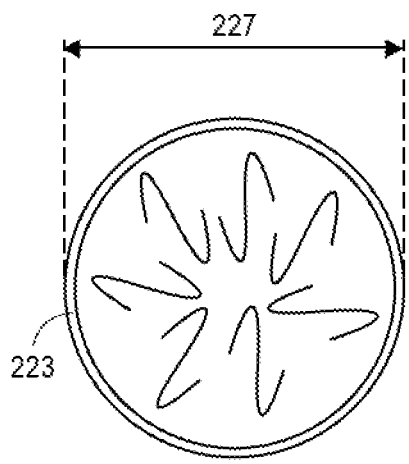
Figure 2F:
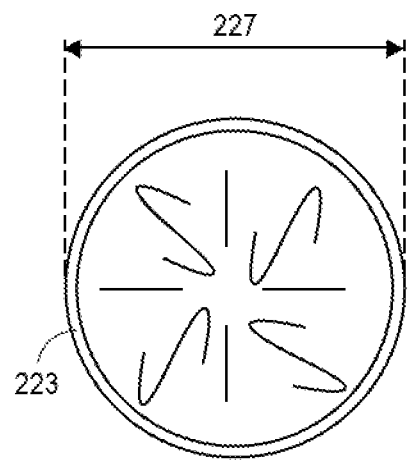
Figure 2E:
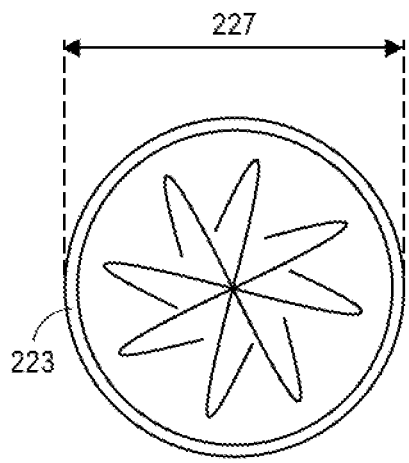

FIGS. 2D-2E illustrate an interconnect structure with a pattern formed from curved line segments that extend from an edge region of the interconnect structure to the center region of the interconnect structure. The pattern shown in FIG. 2D differs from the pattern shown in FIG. 2E because the pattern shown in FIG. 2D comprises line segments that do not intersect each other, while the pattern shown in FIG. 2E comprises line segments that intersect each other. Any number of line segments may be used to form the patterns in FIGS. 2D-2E. Additionally, the line segments in FIGS. 2D-2E may or may not extend from the perimeter of the edge region 223 to the center of the center region 227. For example, the line segments may not align with the center of the center region 227.

FIG. 2F illustrates an interconnect structure with a pattern formed from straight and curved line segments that extend from an edge region of the interconnect structure to the center region of the interconnect structure. The pattern shown in FIG. 2F may be viewed as a combination of the patterns shown in FIGS. 2B and 2D, each of which is described in more detail above.

Figure 2G:
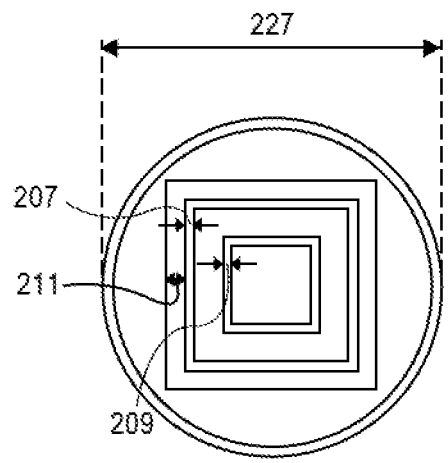

FIG. 2G illustrates an interconnect structure with a pattern formed from polygons. The illustrated pattern shows a plurality of squared-shaped polygons, but any suitable polygon may be used to form the pattern (e.g., a polygon having three or more sides, a convex polygon, a non-convex polygon, a self-intersecting polygon, a star polygon, a monotone polygon, a rectilinear polygon, an equiangular polygon, a cyclic polygon, an isogonal or vertex-transitive polygon, an equilateral polygon, a tangential polygon, an isotoxal or edge-transitive polygon, a regular polygon, any combination thereof, etc.). The pattern shown in FIG. 2G includes concentric polygons, however, the polygons need not be concentric. For example, the pattern can be formed from: two or more concentric polygons; two or more non-concentric polygons; or any combination thereof. Furthermore, the spacing between the polygons can be uniform or non-uniform. For example, and as shown in FIG. 2G, the spacing 207 and the spacing 209 are uniform with regard to each other, while the spacing 211 is non-uniform with regard to each of the spacing 207 and the spacing 209.

It is to be appreciated that the patterns shown in FIGS. 2A-2G are merely illustrative and not exhaustive. That is, the patterns can be formed using any type of line segment, polygon, shape, or any combination thereof.

Figure 3A:
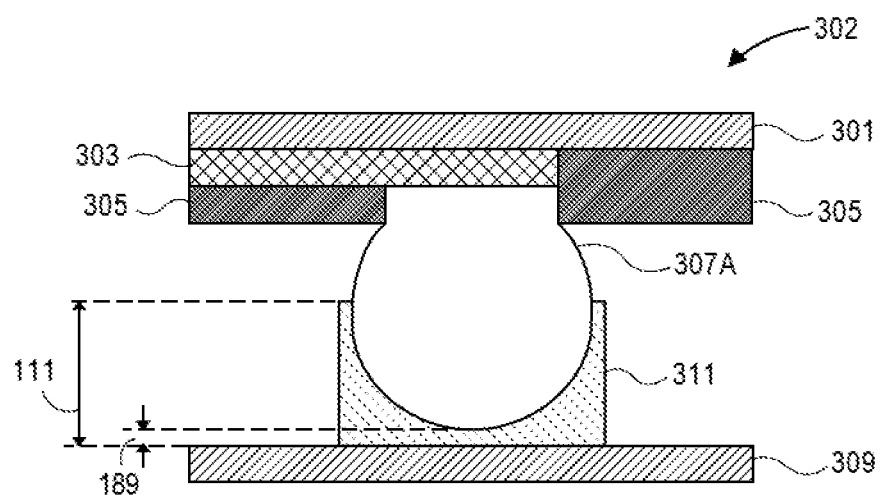
FIGS. 3A-3C are cross sectional illustrations of embodiments of a bowl shaped pad and an interconnect joint.

Moving on to FIG. 3A, a cross sectional view of an interconnect structure 302 that includes a bowl shaped pad 311 and an interconnect joint 307A is shown, in accordance with one embodiment. The structure 302 comprises a first substrate 301, a pad 303 on the first substrate 301, a mask 305, an interconnect joint 307A, a second substrate 309, and a bowl shaped pad on the second substrate 309. Furthermore, a center region of the interconnect joint 307A has a thickness 189 that is smaller than a thickness 111 of an edge region of the interconnect joint 307A.

The interconnect structure 302 shown in FIG. 3A may assist with improving interconnect joint reliability when compared to conventional interconnect structures. For example, the interconnect structure 302 can assist with minimizing or eliminating one or more of the drawbacks associated with underfill materials and glues, as described above. In some scenarios, the interconnect structure 302 can enable creation of interconnect joints that do not need underfill or glues to improve interconnect joint reliability. The benefits associated with the structure 302 are due to an increased contact area for the interconnect joint 307A that is attributable to the bowl shaped pad 311. As explained above, a bowl shaped pad (e.g., pad 311, etc.) is characterized by a non-uniform thickness, as opposed to a flat pad (e.g., pad 303, etc.) that is characterized by a uniform thickness. The flat pad's uniform thickness causes a limited contact area for solder (or other suitable material) used to form the interconnect joint 307A between the flat pad and another pad. This limited contact area can reduce interconnect joint reliability. In contrast, the interconnect structure 302 includes the bowl shaped pad 311, which is characterized by a non-uniform thickness. The bowl shaped pad 311 has an increased contact area for solder (or other suitable material) used to form the interconnect joint 307A between the bowl shaped pad 311 and the pad 303 when compared to the limited contact area of a flat pad. This increased contact area enables the material used to form the interconnect joint 307A to "sit" in the bowl shaped pad 311, which in turn assists with improving the strength of the joint between the pad 303 and the bowl shaped pad 311. In this way, the structure 302 can assist with improving reliability of the interconnect joint and with minimizing or eliminating use of underfill materials and glue to improve reliability of the interconnect joint. Minimizing the use of underfill materials and/or glue can assist with reducing costs associated with semiconductor packaging and manufacturing and with facilitating increased control over processes used in semiconductor packaging and manufacturing. Reductions in cost and increased control over processes can in turn reduce failure rates of interconnect joints, which can in turn assist with improving life cycles of packages, PCBs, and electronic devices.

The first substrate 301 and second substrate 309 can be any known substrate (e.g., a semiconductor package, a PCB, an interposer, etc.). Although not shown in FIG. 3A, a semiconductor die having a pad could replace the first substrate 301 and the pad 303. Each of the pads 303 and 311 may be formed from a conductive material (e.g., copper, etc.) The pad 303 may be a flat pad. The interconnect joint 307A may be formed from any suitable material (e.g., solder, gold, conductive epoxy, copper, any combination thereof, etc.). For example, a solder paste may be deposited in the bowl shaped structure 311 and reflowed to permanently couple the pad 303 to the bowl shaped structure 311.

Figure 3B:
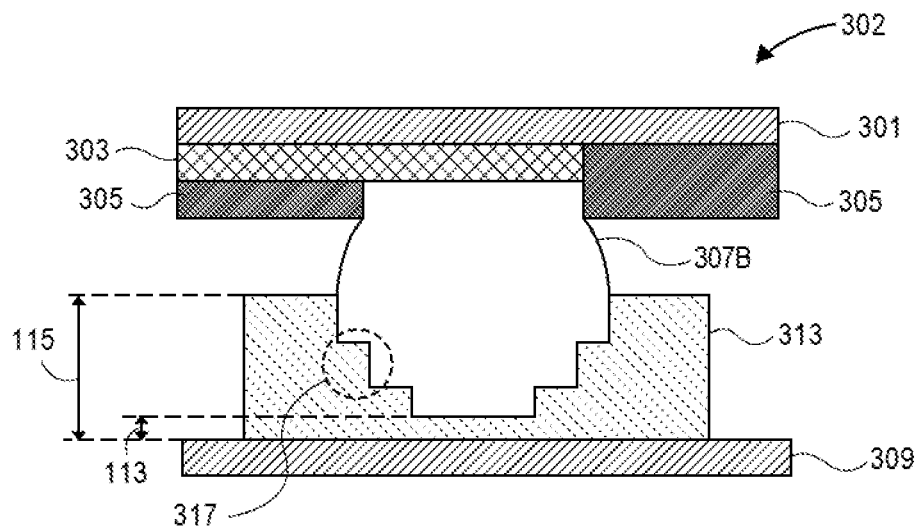

Moving on to FIG. 3B, a cross sectional view of an interconnect structure 302 that includes a bowl shaped structure 313 and an interconnect joint 307B is shown. The interconnect structure 302 shown in FIG. 3B is similar to the structure 302 shown in FIG. 3A, with the exception that the bowl shaped pad 311 shown in FIG. 3B has a stepped profile comprising steps 317 instead of a curved profile. Furthermore, a center region of the interconnect joint 307B has a thickness 113 that is smaller than a thickness 115 of an edge region of the interconnect joint 307B.

Figure 3C:
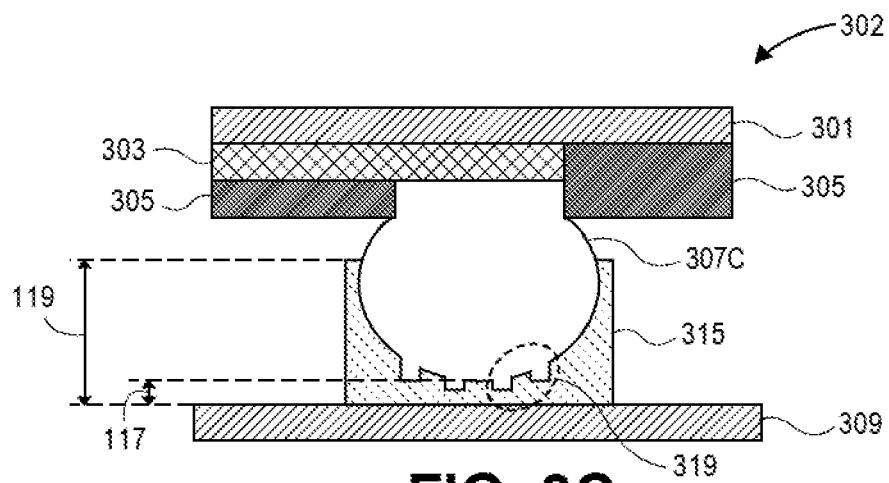

Regarding FIG. 3C, a cross sectional view of an interconnect structure 302 that includes a bowl shaped structure 315 and an interconnect joint 307C is shown. The interconnect structure 302 shown in FIG. 3C is similar to the interconnect structure 302 shown in FIG. 3B with the exception that the bowl shaped pad 315 has a curved profile that includes a pattern 319 formed in the surface of the bowl shaped pad 315. Furthermore, a center region of the interconnect joint 307C has a thickness 117 that is smaller than a thickness 119 of an edge region of the interconnect joint 307C.

Figure 4A:
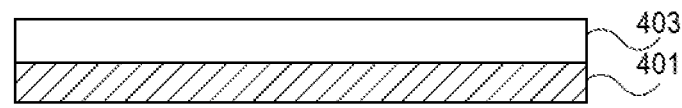
FIGS. 4A-4I illustrate a technique of forming a bowl shaped pad characterized by a stepped profile in accordance with an embodiment.
Figure 4B:
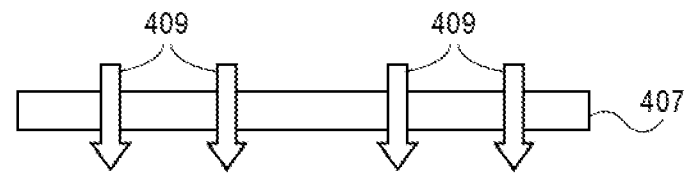
Figure 4B:
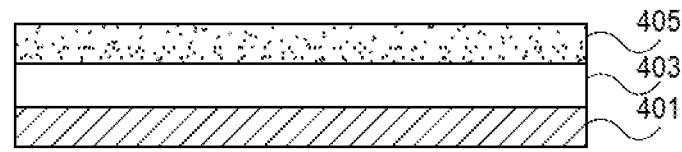
Figure 4C:
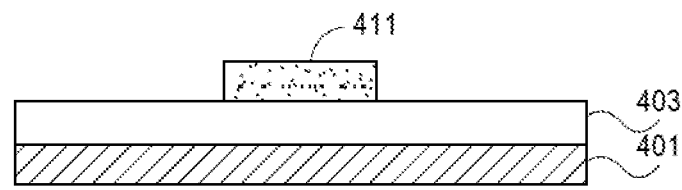
Figure 4D:
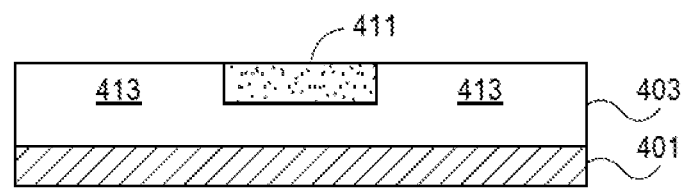

FIGS. 4A-4I illustrate of a technique of forming an interconnect structure having a bowl shaped pad characterized by a stepped profile in accordance with an embodiment. With regard now to FIG. 4A, a substrate 401 is provided. A first metal layer 403 is deposited on the substrate 401. Next, in FIG. 4B, a resist layer 405 is deposited on the first metal layer 403. The resist layer 405 can be formed from positive or negative resist materials. Next, and as shown in FIG. 4B, the resist layer 405 is lithographically patterned using a mask 407 and light 409. Following exposure of the resist layer 405 to the light 409, an exposure pattern is formed in the resist layer 405. The exposure pattern is subjected to a developer that removes (un)exposed portions of the resist layer 405 and leaves a processed portion 411 of the resist layer 405, which is shown in FIG. 4C. Afterwards, a metallic material is deposited on adjacent sides of the processed portion 411 to form a second metal layer 413 on the first metal layer 403, as shown in FIG. 4D. Top sides of the metal layer 413 and the processed portion 411 may or may not be coplanar with each other.

Figure 4E:
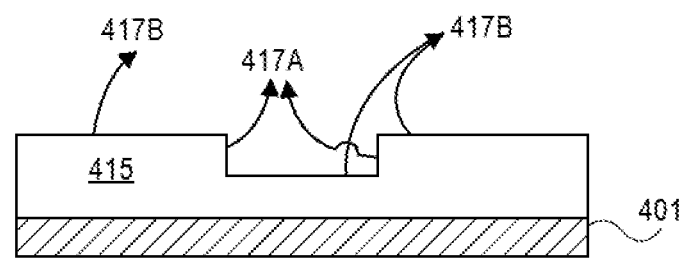

With regard now to FIG. 4E, the processed portion 411 may be removed using any suitable technique of removing (un)exposed resist materials known in the art (e.g., resist stripping, etc.). Removal of the processed portion 411 reveals a first structure 415 that includes a first set of steps. Each of the first set of steps has a vertical wall 417A and a horizontal wall 417B.

Figure 4F:
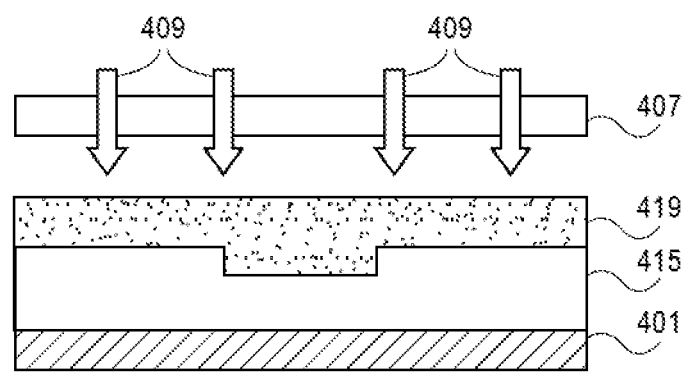
Figure 4G:
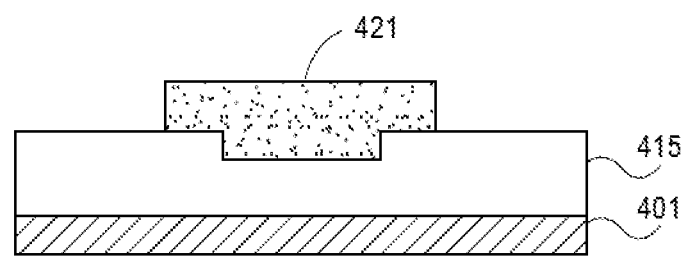

Moving on to FIG. 4F, a second resist layer 419 is deposited on the first structure 415 such that the walls 417A-B are encapsulated or covered by the second resist layer 419. The second resist layer 419 is then lithographically patterned using the mask 407 and the light 409. After the resist layer 419 is exposed to the light 409, an exposure pattern is formed in the resist layer 419. The exposure pattern is subjected to a developer that removes (un)exposed portions of the resist layer 419 and leaves a processed portion 421 of the resist layer 419, which is shown in FIG. 4G.

Figure 4H:
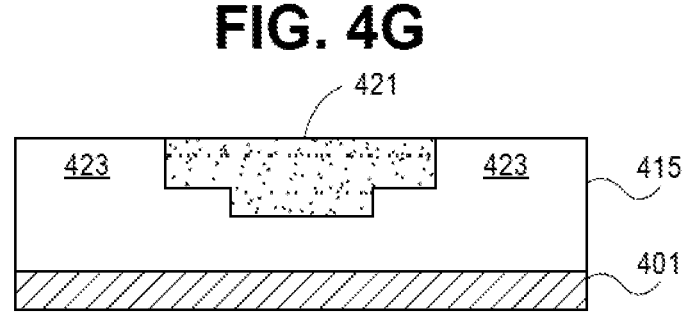

Subsequently, and as shown in FIG. 4H, a metallic material is deposited on adjacent sides of the processed portion 421 to form a third metal layer 423 on the first structure 415, as shown in FIG. 4H. It is to be appreciated that the third metal layer 423 is formed on the topmost horizontal walls 417B of the structure 415. Top sides of the metal layer 423 and the processed portion 421 may or may not be coplanar with each other.

Figure 4I:
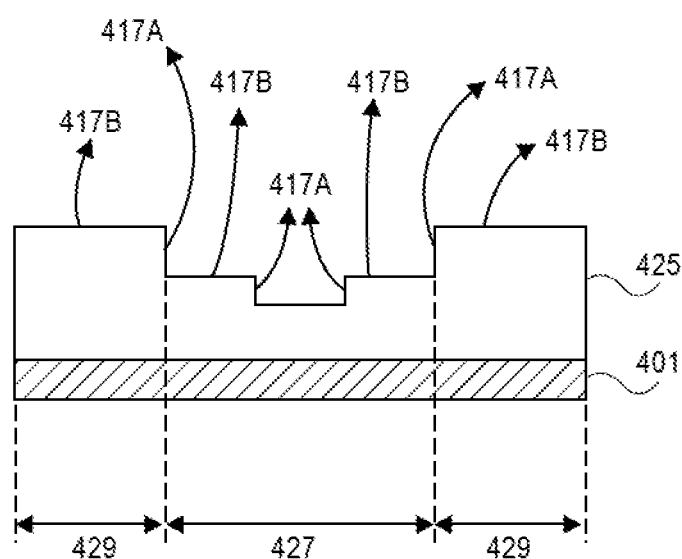

With regard now to FIG. 4I, the processed portion 421 may be removed (e.g., via resists stripping, etc.) to form a bowl shaped structure 425 having horizontal walls 417B and vertical walls 417A. The bowl shaped structure 433 comprises a center region 427 and an edge region 429. The steps of the structure 425 enable the structure 427 to exhibit a stepped profile.

Figure 5A:
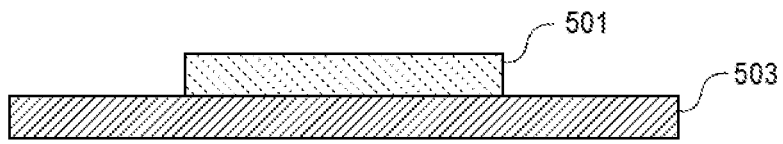
FIGS. 5A-5B illustrate a method of forming a bowl shaped pad characterized by a curved profile in accordance with one embodiment.
Figure 5B:
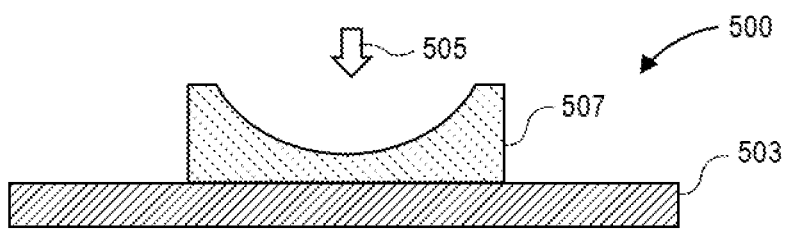

FIGS. 5A-5B illustrate a method of forming an interconnect structure 500 that includes a bowl shaped structure 507 characterized by a curved profile in accordance with one embodiment. Beginning with FIG. 5A, a metallic structure 501 (e.g., one or more metal layers, etc.) is deposited on a substrate 503. Next, the metallic structure 501 may be etched. For example, and as shown in FIG. 5B, laser etching 505 may be used to remove a portion of the metallic structure 501. The etching can be controlled to modify the metallic structure 501 into a bowl shaped structure 507 that exhibits a curved profile. In this way, the interconnect structure 500 is formed.

Figure 6A:
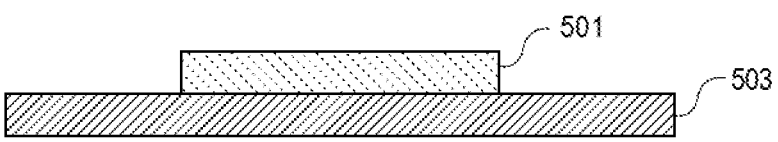
FIGS. 6A-6B illustrate a method of forming a bowl shaped pad characterized by a stepped profile in accordance with one embodiment.
Figure 6B:
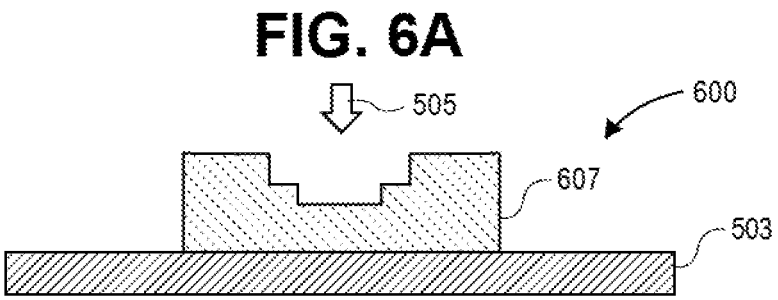

FIGS. 6A-6B illustrate a method of forming an interconnect structure 600 that includes a bowl shaped structure 607 characterized by a stepped profile in accordance with one embodiment. Beginning with FIG. 6A, a metallic structure 501 is deposited on a substrate 503. Next, the metallic material 501 may be etched. For example, and as shown in FIG. 6B, laser etching 505 may be used to remove a portion of the metallic structure 501. The etching can be controlled to modify the metallic structure 501 into a bowl shaped structure 607 that exhibits a stepped profile. In this way, the interconnect structure 600 is formed.

Figure 7A:
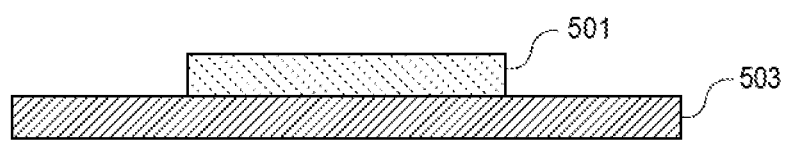
FIGS. 7A-7B illustrate a method of forming a bowl shaped pad characterized by a pattern formed therein and a curved profile.
Figure 7B:
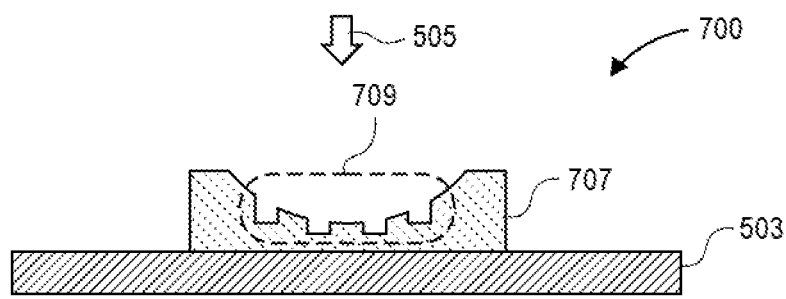

FIGS. 7A-7B illustrate a method of forming an interconnect structure 700 that includes a bowl shaped structure 707 characterized by a curved profile and a pattern 709 formed in the structure 707, according to one embodiment. Beginning with FIG. 7A, a metallic structure 501 is deposited on a substrate 503. Next, the metallic material 501 is etched. For example, and as shown in FIG. 7B, laser etching 505 is used to remove a portion of the metallic structure 501. The etching can be controlled to modify the metallic structure 501 into a bowl shaped structure 707 that exhibits a curved profile and a pattern 709 formed in the surface of the structure 707. In this way, the interconnect structure 700 is formed.

Figure 8:
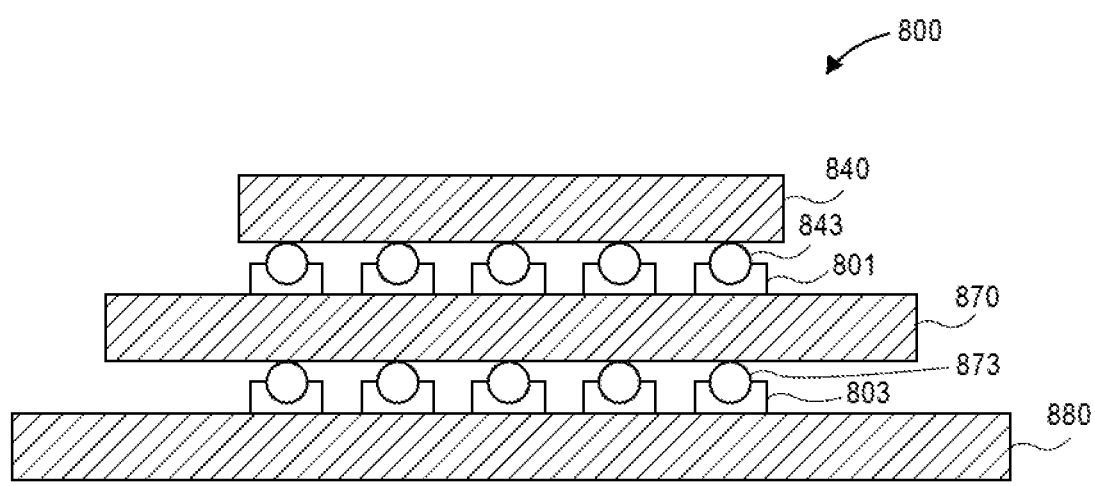
FIG. 8 illustrates a cross-sectional illustration of a packaged system, according to an embodiment.

Referring now to FIG. 8, which illustrates a cross-sectional view of a packaged system 800 comprised of interconnect structures 801 and 803 that each include a bowl shaped structure, in accordance with an embodiment. In an embodiment, the packaged system 800 may include a semiconductor die 840 electrically coupled to a package substrate 870 with solder bumps 843 and interconnect structures 801. For additional embodiments, the semiconductor die 840 may be electrically coupled to the package substrate 870 with a combination of interconnect structures 801 and any other suitable interconnect architecture, such as wire bonding or the like. The package substrate 870 may be electrically coupled to a board, such as a printed circuit board (PCB) 880, with solder bumps 873 and interconnect structures 803. For additional embodiments, the package substrate 870 may be electrically coupled to a board, such as the PCB 880, with a combination of interconnect structures 803 and any other suitable interconnect architecture, such as wire bonding or the like. Each of the interconnect structures 801 and 803 can be similar to or the same as one or more of the interconnect structures described above in connection with FIGS. 1A-7B.

In one embodiment, the solder bumps 843, 873 is used together with the interconnect structures 801, 803 to form interconnect joints. Embodiments of interconnect structures and interconnect joints are described above in connection with one or more of FIGS. 1A-7B. In an embodiment, one or more the interconnect structures 801, 803 formed based on one or more of the embodiments described above may be integrated on or into: (i) the package substrate 870; (ii) the board 880; or (iii) the package substrate 870 and the board 880. Embodiments include any number of one or more the interconnect structures 801, 803 formed on or into the package substrate 870 and/or the board 880. For example, a plurality of one or more interconnect structures 801, 803 may be integrated—for permanently coupling two components or any other desired use—into: (i) the package substrate 870; (ii) the board 880; or (iii) the package substrate 870 and the board 880.

Figure 9:
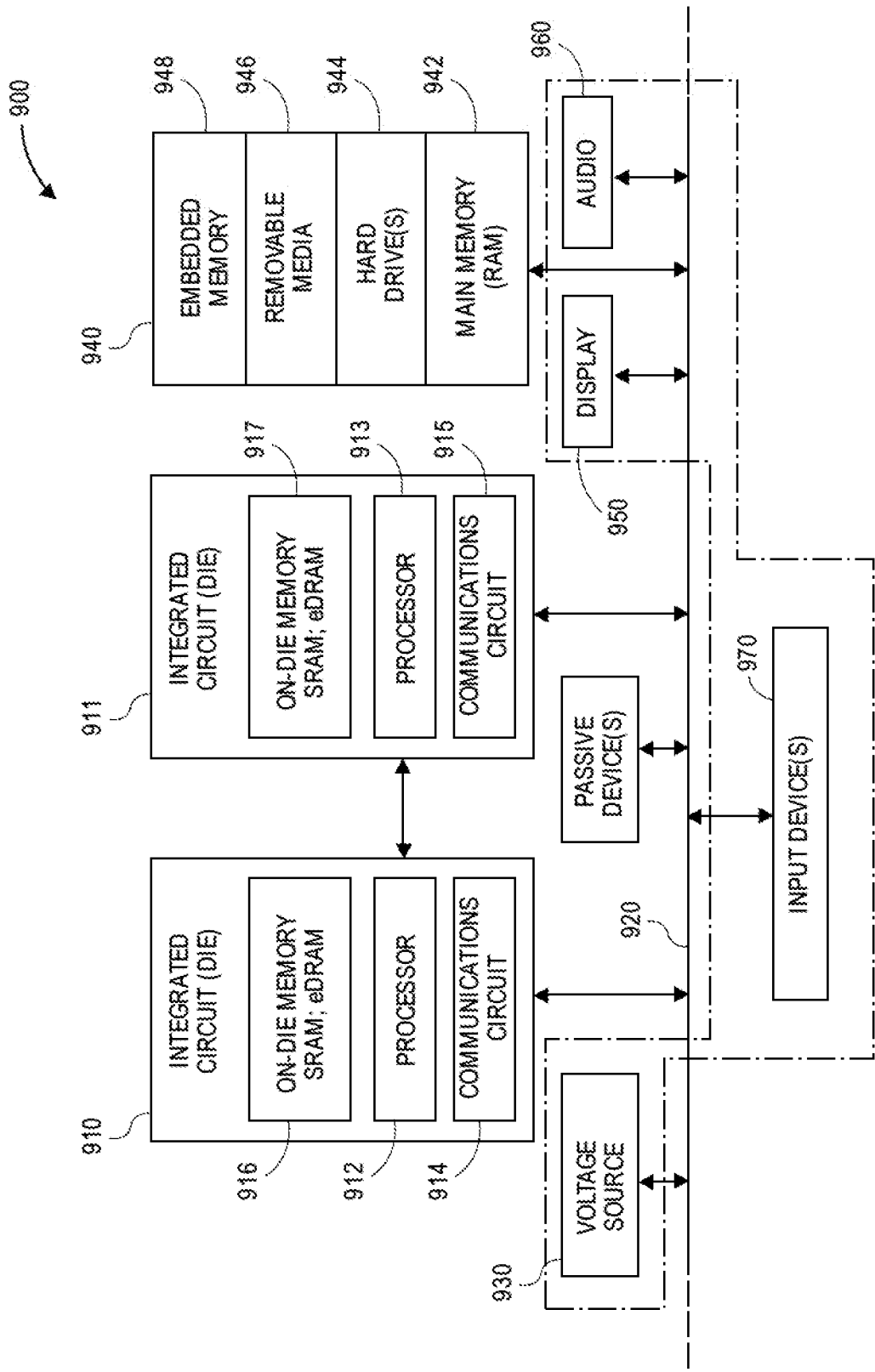
FIG. 9 is an illustration of a schematic block diagram of a computer system, according to an embodiment.

FIG. 9 illustrates a schematic of computer system 900 according to an embodiment. The computer system 900 (also referred to as an electronic system 900) can include interconnect structures formed thereon or therein in accord with any of the embodiments and their equivalents as set forth in this disclosure. The computer system 900 may be a mobile device, a netbook computer, a wireless smart phone, a desktop computer, a hand-held reader, a server system, a supercomputer, or a high-performance computing system.

The system 900 can be a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In one embodiment, the voltage source 930 supplies current to the integrated circuit 910 through the system bus 920.

The integrated circuit 910 is electrically coupled to the system bus 920 and includes any circuit, or combination of circuits according to an embodiment. In an embodiment, the integrated circuit 910 includes a processor 912. As used herein, the processor 912 may mean any type of circuit such as, but not limited to, a microprocessor, a microcontroller, a graphics processor, a digital signal processor, or another processor. In an embodiment, the processor 912 includes, or is coupled with, a semiconductor package comprising interconnect structures formed thereon or therein in accordance with any of the embodiments and their equivalents, as described in the foregoing specification. In an embodiment, SRAM embodiments are found in memory caches of the processor. Other types of circuits that can be included in the integrated circuit 910 are a custom circuit or an application-specific integrated circuit (ASIC), such as a communications circuit 914 for use in wireless devices such as cellular telephones, smart phones, pagers, portable computers, two-way radios, and similar electronic systems, or a communications circuit for servers. In an embodiment, the integrated circuit 910 includes on-die memory 916 such as static random-access memory (SRAM). In an embodiment, the integrated circuit 910 includes embedded on-die memory 916 such as embedded dynamic random-access memory (eDRAM). In one embodiment, the on-die memory 916 may be packaged with a process in accord with any of the embodiments and their equivalents, as described in the foregoing specification.

In an embodiment, the integrated circuit 910 is complemented with a subsequent integrated circuit 911. Useful embodiments include a dual processor 913 and a dual communications circuit 915 and dual on-die memory 917 such as SRAM. In an embodiment, the dual integrated circuit 910 includes embedded on-die memory 917 such as eDRAM.

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital variable disks (DVDs), flash memory drives, and other removable media known in the art. The external memory 940 may also be embedded memory 948 such as the first die in a die stack, according to an embodiment.

In an embodiment, the electronic system 900 also includes a display device 950 and an audio output 960. In an embodiment, the electronic system 900 includes an input device such as a controller 970 that may be a keyboard, mouse, trackball, game controller, microphone, voice-recognition device, or any other input device that inputs information into the electronic system 900. In an embodiment, an input device 970 is a camera. In an embodiment, an input device 970 is a digital sound recorder. In an embodiment, an input device 970 is a camera and a digital sound recorder.

At least one of the integrated circuits 910 or 911 can be implemented in a number of different embodiments, including a semiconductor package comprising interconnect structures formed thereon or therein as described herein, an electronic system, a computer system, one or more methods of fabricating an integrated circuit, and one or more methods of fabricating an electronic assembly that includes interconnect structures formed thereon or therein, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the semiconductor package comprising inductor features and a magnetic film in accordance with any of the disclosed embodiments as set forth herein and their art-recognized equivalents. A foundation substrate may be included, as represented by the dashed line of FIG. 9. Passive devices may also be included, as is also depicted in FIG. 9.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "In an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semiconductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures. As used herein, the phrases "A or B", "A and/or B", "one or more of A and B", and "at least one of A or B" means (A), (B), or (A and B).

In the foregoing description, the metal pad of an interconnect structure is described as having a curved profile or a stepped profile. It is to be appreciated that other profiles (not shown) may be used and that any combination of profiles may be used.

Embodiments described herein include an interconnect structure, comprising: a substrate; and a metal pad over the substrate, wherein the metal pad has a center region and an edge region, wherein a thickness of the center region is smaller than a thickness of the edge region.

Additional embodiments include an interconnect structure, wherein a thickness of the center region is non uniform.

Additional embodiments include an interconnect structure, wherein the center region is characterized by a stepped profile, wherein the stepped profile is formed from steps, and wherein each step comprises a horizontal surface and a vertical surface.

Additional embodiments include an interconnect structure, wherein the center region is characterized by a curved profile.

Additional embodiments include an interconnect structure, further comprising a pattern formed in a surface of the metal pad.

Additional embodiments include an interconnect structure, wherein the pattern comprises one or more polygons.

Additional embodiments include an interconnect structure, wherein the pattern comprises a circle or an ellipse.

Additional embodiments include an interconnect structure, wherein the pattern comprises a line segment.

Additional embodiments include an interconnect structure, wherein the line segment extends from the center region to the edge region.

Additional embodiments include an interconnect structure, wherein the line segment is a straight line segment.

Additional embodiments include an interconnect structure, wherein the line segment is a curved line segment.

Additional embodiments include an interconnect structure, wherein the substrate is a printed circuit board.

Additional embodiments include an interconnect structure, wherein the substrate is a semiconductor package.

Additional embodiments include an interconnect structure, further comprising an interconnect joint on the metal pad.

Embodiments described herein include an interconnect structure, comprising: a first substrate; a metal pad over the first substrate, wherein the metal pad has a center region and an edge region, wherein a thickness of the center region is smaller than a thickness of the edge region; a second substrate over the metal pad; and solder disposed in or on the metal pad, the solder coupling the first and second substrates to each other.

Additional embodiments include an interconnect structure, wherein a thickness of the center region is non uniform.

Additional embodiments include an interconnect structure, wherein the center region comprises steps having non uniform thicknesses.

Additional embodiments include an interconnect structure, wherein the center region comprises a curved surface.

Additional embodiments include an interconnect structure, wherein one or more patterns are formed in one or more of center and edge regions of the metal pad.

Additional embodiments include an interconnect structure, wherein the one or more patterns comprise at least one selected from a group consisting of: a circle, a polygon, and a line segment.

Embodiments described herein include a method, comprising: depositing a metallic material on a substrate; and patterning the metallic material to fabricate an interconnect structure, wherein the interconnect structure comprises a metal pad over the substrate, wherein the metal pad has a center region and an edge region, and wherein a thickness of the center region is smaller than a thickness of the edge region.

Additional embodiments include a method, wherein patterning the metallic material comprises etching the metallic material.

Additional embodiments include a method, wherein etching the metallic material comprises laser etching the metallic material.

Embodiments described herein include a method, comprising: depositing a first metal layer on a substrate; depositing a resist layer on the first metal layer; patterning, via one or more lithography techniques, the resist layer to create a processed portion of the resist layer on first metal layer; depositing a second metal layer on adjacent sides of the processed portion of the resist layer; and removing the processed portion of the resist layer to reveal an interconnect structure, wherein the interconnect structure comprises a metal pad over the substrate, wherein the metal pad has a center region and an edge region, and wherein a thickness of the center region is smaller than a thickness of the edge region.

Additional embodiments include a method, wherein the metal pad has a curved profile, a stepped profile, or a combination thereof.

The invention claimed is:

1. An interconnect structure, comprising:
a substrate; and
a metal pad over the substrate, wherein the metal pad has a center region and an edge region, wherein a thickness of the center region is smaller than a thickness of the edge region, wherein a thickness of the center region is non-uniform, wherein the center region is characterized by a stepped profile, wherein the stepped profile is formed from steps, and wherein each step comprises a horizontal surface and a vertical surface.

2. The interconnect structure of claim 1, wherein the substrate is a printed circuit board.

3. The interconnect structure of claim 1, wherein the substrate is a semiconductor package.

4. The interconnect structure of claim 1, further comprising an interconnect joint on the metal pad.

5. An interconnect structure, comprising:
a first substrate;
a metal pad over the first substrate, wherein the metal pad has a center region and an edge region, wherein a thickness of the center region is smaller than a thickness of the edge region, wherein a thickness of the center region is non-uniform wherein the center region comprises steps having non-uniform thicknesses;
a second substrate over the metal pad; and
solder disposed in or on the metal pad, the solder coupling the first and second substrates to each other.

6. An interconnect structure, comprising:
a substrate; and
a metal pad over the substrate, wherein the metal pad has a center region and an edge region, wherein a thickness of the center region is smaller than a thickness of the edge region, wherein a pattern is formed in a surface of the metal pad, and wherein the pattern comprises one or more polygons.

7. The interconnect structure of claim 6, wherein the substrate is a printed circuit board.

8. The interconnect structure of claim 6, wherein the substrate is a semiconductor package.

9. The interconnect structure of claim 6, further comprising an interconnect joint on the metal pad.

10. An interconnect structure, comprising:
a substrate; and
a metal pad over the substrate, wherein the metal pad has a center region and an edge region, wherein a thickness of the center region is smaller than a thickness of the edge region, wherein a pattern is formed in a surface of the metal pad, and wherein the pattern comprises a line segment.

11. The interconnect structure of claim 10, wherein the line segment extends from the center region to the edge region.

12. The interconnect structure of claim 10, wherein the line segment is a straight line segment.

13. The interconnect structure of claim 10, wherein the line segment is a curved line segment.

14. The interconnect structure of claim 10, wherein the substrate is a printed circuit board.

15. The interconnect structure of claim 10, wherein the substrate is a semiconductor package.

16. The interconnect structure of claim 10, further comprising an interconnect joint on the metal pad.

* * * * *